(12) United States Patent
Nakai

(10) Patent No.: US 8,084,340 B2
(45) Date of Patent: Dec. 27, 2011

(54) METHOD OF MANUFACTURING SEMICONDUCTOR DEVICE AND SEMICONDUCTOR DEVICE

(75) Inventor: Satoshi Nakai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 505 days.

(21) Appl. No.: 11/541,728

(22) Filed: Oct. 3, 2006

(65) Prior Publication Data

US 2007/0232032 A1    Oct. 4, 2007

(30) Foreign Application Priority Data

Mar. 29, 2006  (JP) ................. 2006-092043

(51) Int. Cl.
*H01L 21/425* (2006.01)
(52) U.S. Cl. .......... 438/524; 438/424; 438/514
(58) Field of Classification Search .......... 438/510, 438/424, 514, 524
See application file for complete search history.

(56) References Cited

U.S. PATENT DOCUMENTS

| | | | |
|---|---|---|---|
| 2003/0042511 A1* | 3/2003 | Rhodes | 257/232 |
| 2004/0152288 A1* | 8/2004 | Trogolo et al. | 438/514 |
| 2004/0262622 A1* | 12/2004 | Patrick | 257/79 |
| 2005/0277277 A1* | 12/2005 | Liu et al. | 438/597 |
| 2006/0124999 A1* | 6/2006 | Pendharkar | 257/335 |
| 2007/0049035 A1* | 3/2007 | Tran | 438/696 |
| 2007/0298579 A1* | 12/2007 | Hu et al. | 438/377 |

FOREIGN PATENT DOCUMENTS

JP    10-199993 A    7/1998

OTHER PUBLICATIONS

K. Tomita et al., "Sub-1μm² High Density Embedded SRAM Technologies for 100nm Generation SOC and Beyond", 2002 Symposium on VLSI Technology Digest of Technical Papers, pp. 14-15.

* cited by examiner

*Primary Examiner* — Bradley K Smith

(57) ABSTRACT

A method of manufacturing a semiconductor device whereby, even in cases where ions are implanted into a shallow region of a semiconductor substrate when a deep well is formed, the influence of the ions on a MOSFET can be removed, thereby eliminating the need for increasing the chip area. A photoresist with a thickness matching the wavelength of exposure light is formed over the semiconductor substrate and then is exposed to the exposure light to form a photoresist pattern with an opening corresponding to a region for forming a first well. Subsequently, using the photoresist pattern as a mask, ions are implanted to form the first well, and after the photoresist pattern is removed, an epitaxial layer is grown over the semiconductor substrate. Consequently, the deep well is virtually located deeper in level than at the time of the ion implantation by an amount corresponding to the thickness of the epitaxial layer.

12 Claims, 24 Drawing Sheets

METHOD OF MANUFACTURING SEMICONDUCTOR DEVICE AND SEMICONDUCTOR DEVICE

CROSS-REFERENCE TO RELATED APPLICATIONS

This application is based upon and claims the benefits of priority from the prior Japanese Patent Application No. 2006-092043 filed on Mar. 29, 2006, the entire contents of which are incorporated herein by reference.

BACKGROUND OF THE INVENTION

1. Field of the Invention

The present invention relates to a method of manufacturing a semiconductor device and a semiconductor device, and more particularly, to a semiconductor device with a deep well and a manufacturing method therefor.

2. Description of the Related Art

Semiconductor technology has been unceasingly advancing toward microminiaturization. In the case of transistors, wiring, etc., microminiaturization has evolved according to the scaling law, and performance has also been enhanced by forming, for example, wells (hereinafter referred to as deep wells) with a greater depth than conventional P- or N-type wells to lower power consumption and to remove interference noise.

Microminiaturization of such elements, however, has brought up a number of problems. For example, the problem described below arises during the process of fabrication of a MOSFET (Metal-Oxide Semiconductor Field Effect Transistor).

FIG. 22 is a schematic diagram illustrating ion implantation for the formation of a well. First, a photoresist (not shown) is applied onto a substrate 310, and then a photoresist pattern 320 is formed by exposure and development. Where the exposure is performed using i-line radiation at this time, the border of the photoresist pattern 320 becomes tapered at a certain angle, as shown in FIG. 22. Thus, during the subsequent ion implantation, ions 340 are implanted into regions shallower than a well 330, which is a target doping region with a certain depth, in the vicinity of the border of the photoresist pattern 320.

Meanwhile, with the advance of semiconductor technology toward microminiaturization, exposure techniques using krypton fluoride (KrF) excimer laser light which is shorter in wavelength than i-line radiation have been proposed (e.g., K. Tomita, "Sub-1 µm² High Density Embedded SRAM Technologies for 100 nm Generation SOC and Beyond", 2002 Symposium on VLSI Technology, Digest of Technical Papers, pp. 14-15).

FIG. 23 is a schematic diagram illustrating ion implantation for the formation of a well. As in the case shown in FIG. 22, a photoresist is applied onto a substrate 310, and then a photoresist pattern 420 is formed by exposure and development. Where the exposure is performed using KrF excimer laser light at this time, the taper angle can be made smaller than in the case shown in FIG. 22, thus making it possible to reduce the number of ions 440 in the shallow region in the vicinity of the border of the photoresist pattern 420. It is therefore possible to significantly lessen the influence of the ions upon the channel characteristics of a MOSFET which is formed in the subsequent step, thereby enabling microminiaturization of semiconductor devices.

However, the exposure using KrF excimer laser light is associated with the following problem.

FIG. 24 is a schematic sectional view showing a conventional MOSFET with a triple well structure including a deep well. The MOSFET has a P-type impurity-doped region (hereinafter referred to as P-well) 520, an N-type impurity-doped region (hereinafter referred to as N-well) 530, and STIs (Shallow Trench Isolations) 540. Further, under the P-well 520, a deep, N-type impurity-doped region (hereinafter referred to as deep N-well) 510 is formed, thus constituting a triple well structure. The N-well 530 has P-type source/drain regions 550 formed therein, while the gates are not shown in the figure. To form the deep N-well 510, it is necessary that ions should be implanted deeply. In this case, the ions directed to regions other than the region where the deep N-well 510 is to be formed must be captured by the photoresist which serves as a mask. Namely, the photoresist needs to have a thickness large enough to capture the ions.

However, KrF excimer laser light, which is capable of reducing the taper angle, is short in wavelength and small in focal depth. Thus, where the thickness of the photoresist is 1 µm or more, it is difficult to carry out satisfactory exposure. Consequently, i-line radiation longer in wavelength than KrF excimer laser light must be used to ensure satisfactory exposure while at the same time using a photoresist with an adequate thickness.

With the exposure using i-line radiation, however, ions 560 are implanted into a shallow region of the substrate (in the illustrated example, N-well 530) in the vicinity of the border of the photoresist pattern which is used at the time of forming the deep N-well 510, as mentioned above, with the result that the characteristics of the MOSFET are adversely affected. In the case of the structure as shown in FIG. 24, therefore, the MOSFET needs to be formed at a location free from the influence of the ions 560, which, however, leads to increase of the chip area.

SUMMARY OF THE INVENTION

The present invention was created in view of the above circumstances, and an object thereof is to provide a method of manufacturing a semiconductor device whereby, even in cases where ions are implanted into a shallow region of a semiconductor substrate at the time of forming a deep well, the influence of such ions upon a MOSFET can be removed, thereby eliminating the need for increasing the chip area.

Another object of the present invention is to provide a semiconductor device which is free from the influence of ions implanted into a shallow region of a semiconductor substrate at the time of forming a deep well and which at the same time does not require an increased chip area.

To achieve the first object, there is provided a method of manufacturing a semiconductor device comprising the step of forming, over a semiconductor substrate, a photoresist with a thickness matching a wavelength of exposure light, the step of exposing the photoresist to the exposure light to form a photoresist pattern with an opening corresponding to a region for forming a first well, the step of implanting ions by using the photoresist pattern as a mask, to form the first well, and the step of removing the photoresist pattern and then growing an epitaxial layer over the semiconductor substrate.

Also, to achieve the second object, there is provided a semiconductor device comprising a well which is one of an impurity-doped region formed in a semiconductor layer formed over a semiconductor substrate and an impurity-doped region formed in the semiconductor layer and in an upper portion of the semiconductor substrate, and a deep well located deeper than the well, wherein the semiconductor layer has an epitaxial layer which is grown over the semiconductor substrate after the deep well is formed.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
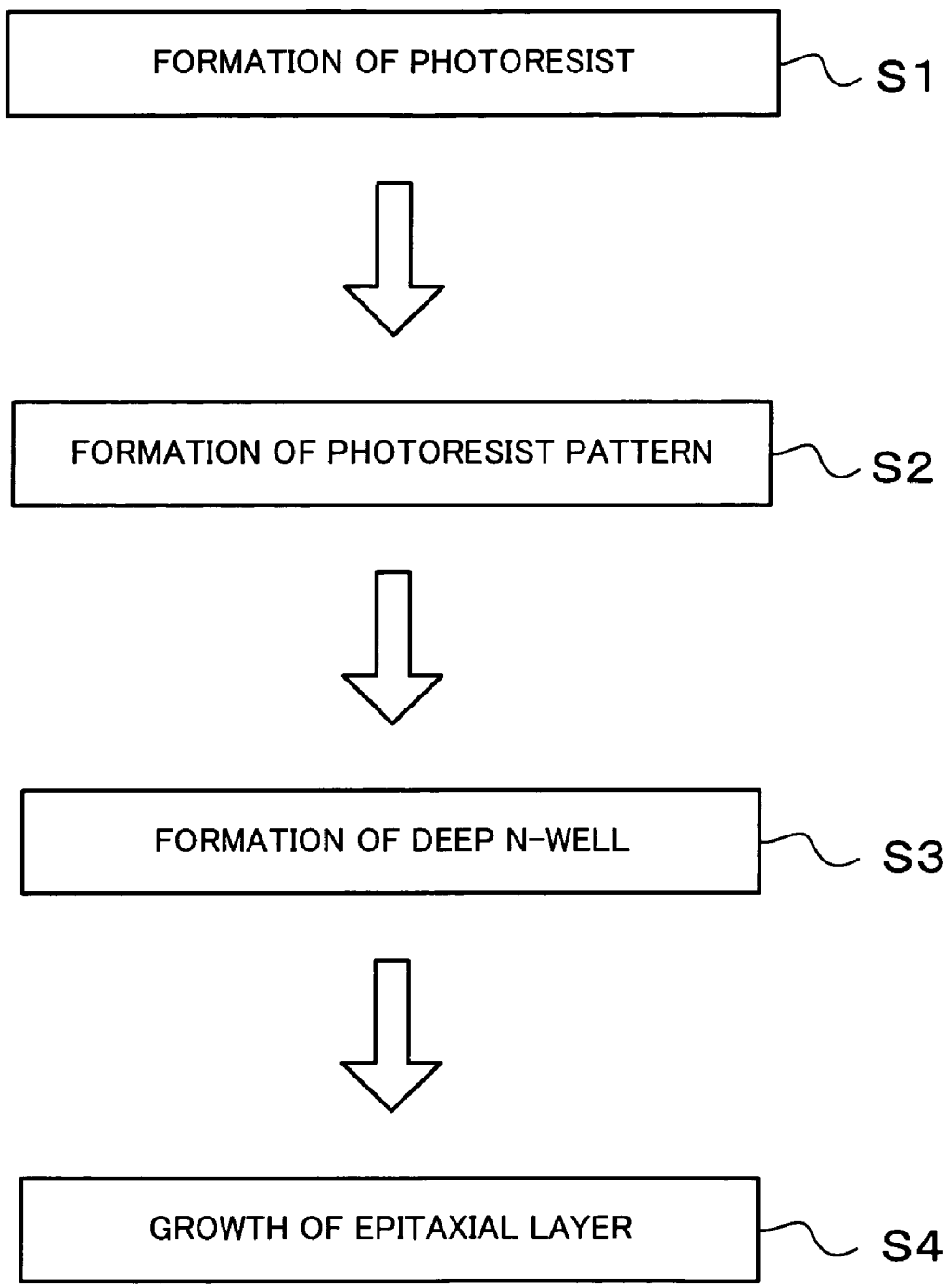
FIG. 1 is a flow diagram showing characteristic steps of a semiconductor device manufacturing method according to an embodiment.
Figure 2:
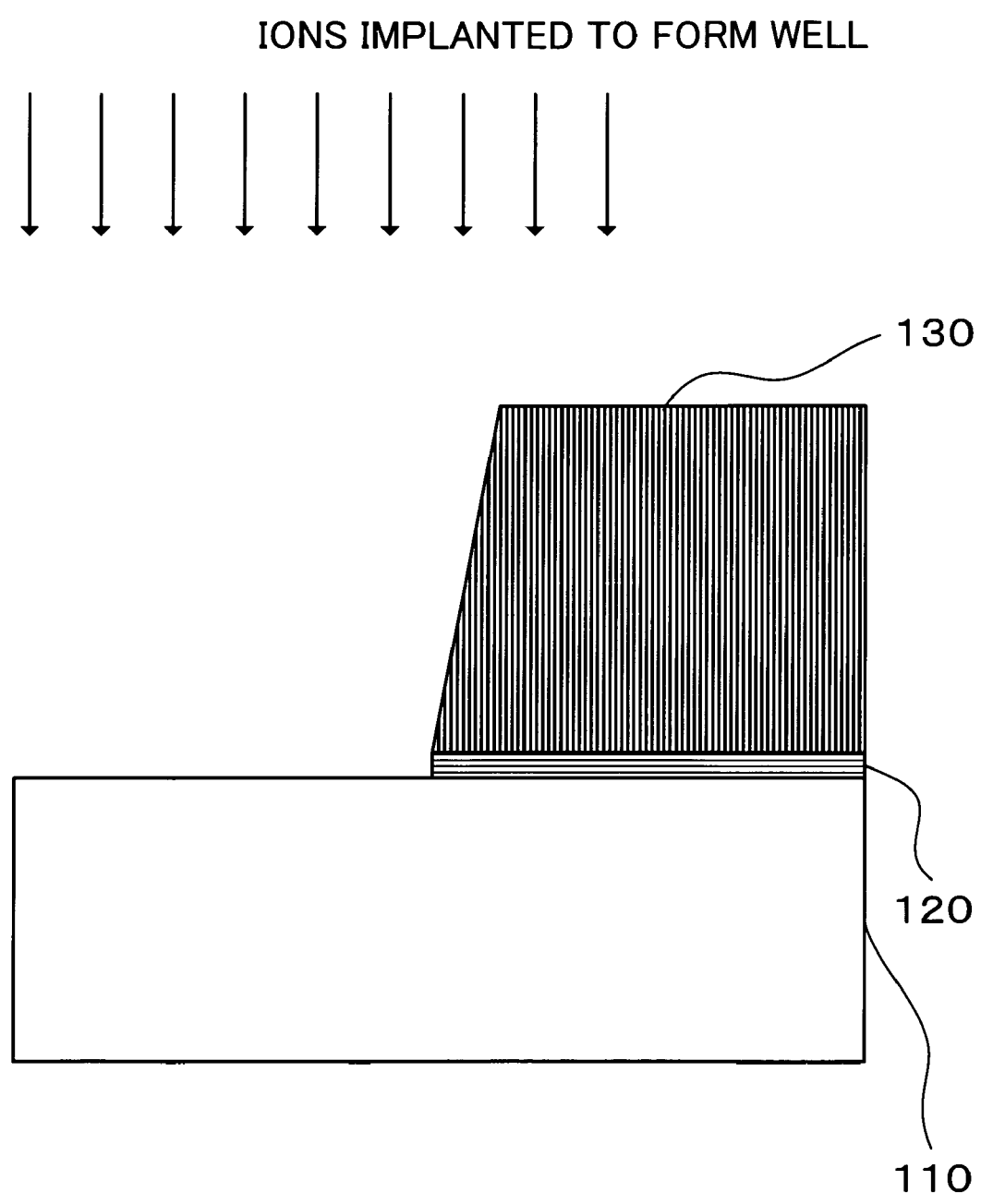
FIG. 2 is a first sectional view illustrating a corresponding step of a MOSFET manufacturing method according to a first embodiment.

Preferred embodiments of the present invention will be described below with reference to the accompanying drawings, wherein like reference numerals refer to like elements throughout.

FIG. 1 is a flow diagram showing characteristic steps of a semiconductor device manufacturing method according to an embodiment. The figure illustrates, in particular, a deep N-well forming step during the process of fabricating a MOSFET with a triple well structure.

First, a photoresist with a thickness matching the wavelength of exposure light is formed over a semiconductor substrate (S1). In the case where the exposure light is i-line radiation, the photoresist is formed so as to have a thickness of approximately 2 µm, for example. On the other hand, where the exposure is to be performed using KrF excimer laser light, the photoresist needs to have a thickness of 1 µm or less in consideration of the focal depth. After the photoresist is formed, it is exposed to KrF excimer laser light or i-line radiation, for example, and is developed to form a photoresist pattern with an opening corresponding to a region for forming a deep N-well (S2). Then, using the photoresist pattern as a mask, ions are implanted to form a deep N-well (S3). Subsequently, the photoresist pattern is removed, and an epitaxial layer is grown over the semiconductor substrate (S4).

Thus, with the semiconductor device manufacturing method of the embodiment, even in the case where i-line radiation, for example, is used for the exposure and ions are implanted into a region for forming a shallow well when a deep N-well is formed, the shallow, ion-implanted region is virtually shifted deeper in level than at the time of the ion implantation by an amount corresponding to the thickness of the epitaxial layer, whereby a MOSFET formed later in the shallow region can be prevented from being influenced by the ions. It is therefore unnecessary to take into account the influence of the ions implanted into the shallow well upon the channel characteristics of the MOSFET, permitting the MOSFET to be arranged in a desired position and thus eliminating the need for increasing the chip area.

The deep N-well is also virtually shifted deeper in level than at the time of the ion implantation by the amount corresponding to the thickness of the epitaxial layer. Accordingly, even with the use of a photoresist with a thickness of 1 µm or less, for example, which is suited for the exposure using KrF excimer laser light, a deep N-well with a desired depth can be formed easily by adjusting the thickness of the epitaxial layer.

Because of these advantages, moreover, it is unnecessary to take into account the positional relationship between the deep N-well and the MOSFET located above the N-well even in cases where the deep N-well must be deliberately positioned, as set forth in Unexamined Japanese Patent Publication No.

H10-199993, for example. Thus, the constraint on the positioning no longer exists, making it possible to reduce the chip area.

The semiconductor device manufacturing method of the embodiment will be now described in detail.

FIGS. 2 through 12 are sectional views illustrating respective steps of a MOSFET manufacturing method according to a first embodiment.

Figure 3:
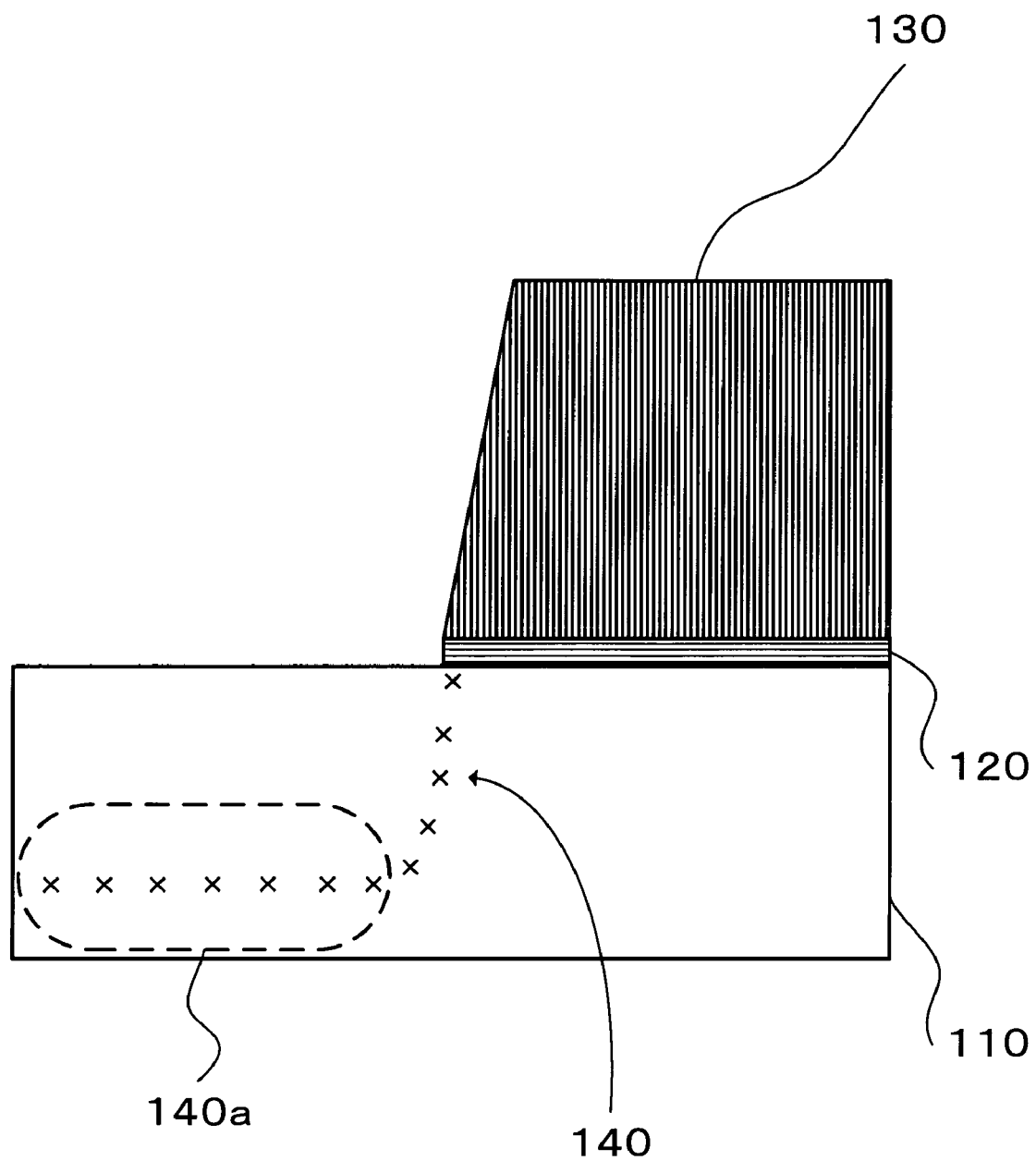
FIG. 3 is a second sectional view illustrating a corresponding step of the MOSFET manufacturing method according to the first embodiment.

An oxide film 120 of 10 nm thick is formed over a P-type silicon (Si) substrate 110, and a photoresist (not shown) for i-line radiation exposure is applied onto the oxide film to a thickness of 2 μm. After the photoresist is applied, the photoresist is exposed to i-line radiation and developed, to form a photoresist pattern 130 with an opening corresponding to a region for forming a deep N-well. Using the photoresist pattern 130 as a mask, phosphorus (P) ions are implanted into the P-type Si substrate 110 (FIG. 2) with implantation energy of 700 keV and an implantation dose of $1.5 \times 10^{13}$ cm$^{-2}$, thus forming a deep N-well 140a (FIG. 3).

Figure 4:
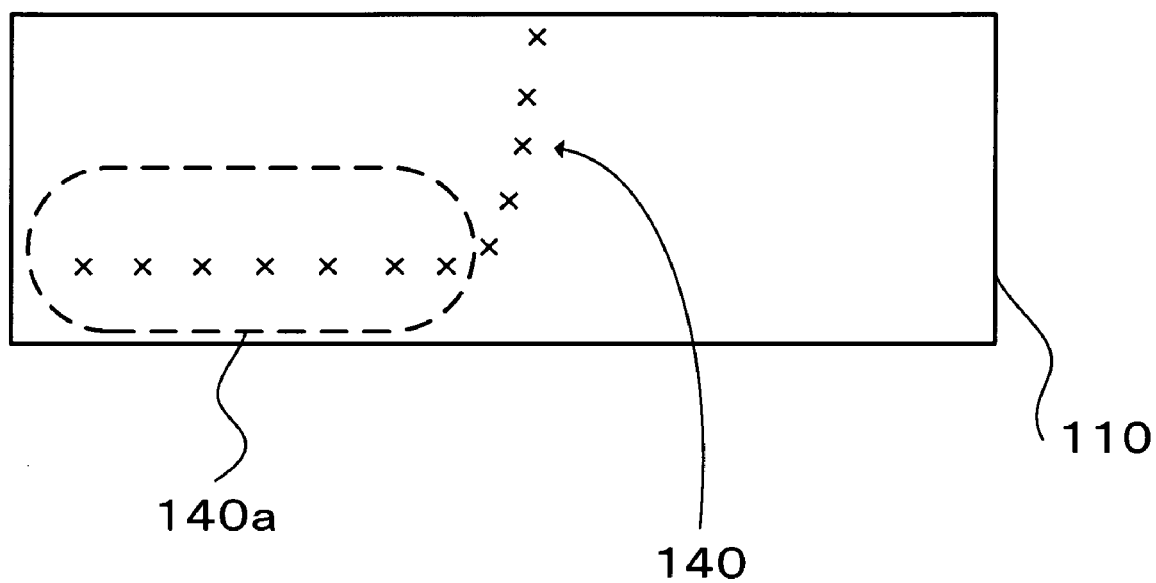
FIG. 4 is a third sectional view illustrating a corresponding step of the MOSFET manufacturing method according to the first embodiment.

At the time of the P ion implantation, P ions directed to the region covered with the photoresist pattern 130 are captured by the photoresist and do not reach the P-type Si substrate 110. The photoresist pattern 130 for i-line radiation exposure has a substantial taper angle, as mentioned above, and therefore, ions 140 are implanted into a shallow region (FIG. 3). After the ions 140 are implanted, the oxide film 120 and the photoresist pattern 130 are removed (FIG. 4).

Figure 5:
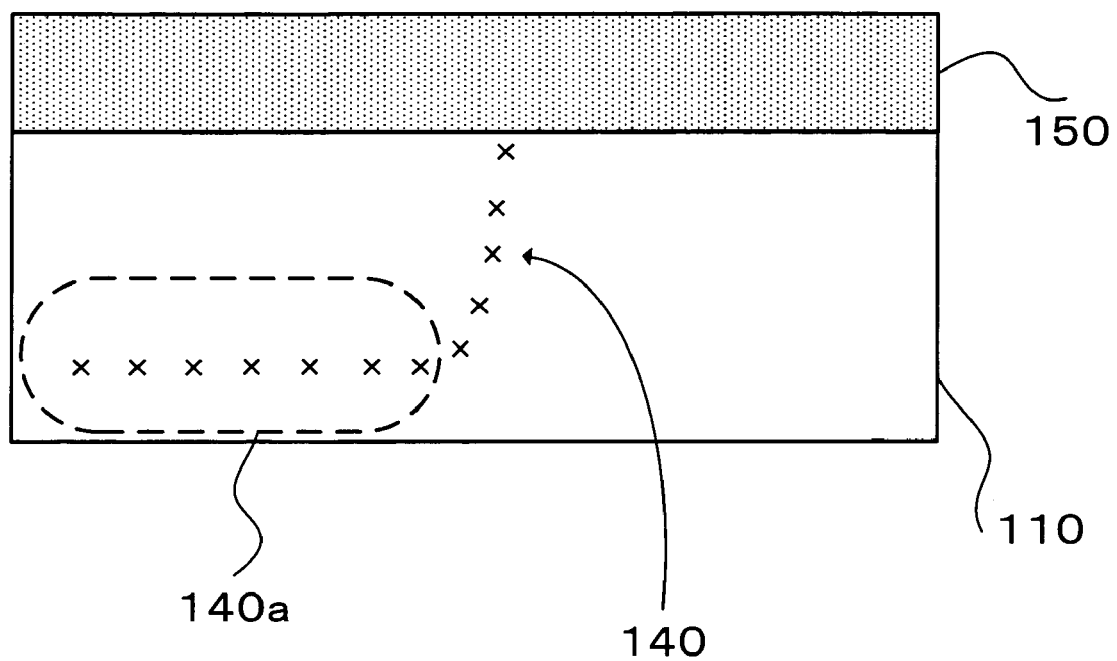
FIG. 5 is a fourth sectional view illustrating a corresponding step of the MOSFET manufacturing method according to the first embodiment.

Subsequently, a Si layer 150 of 20 nm to 200 nm thick is grown by epitaxy over the P-type Si substrate 110 from which the oxide film 120 and the photoresist pattern 130 have been removed (FIG. 5). Since the Si layer 150 is grown over the P-type Si substrate, the ions 140 in the shallow region are virtually shifted deeper in level than at the time of the ion implantation by an amount corresponding to the thickness of the Si layer 150. This makes it possible to prevent the ions from exerting an influence upon the channel characteristics (threshold voltage etc.) of a MOSFET which is formed in the Si layer 150 and the P-type Si substrate 110 in a subsequent step.

It is known that according to the scaling law, the smaller the MOSFET size, the higher the impurity concentration of the channel becomes. Thus, as the MOSFET size is reduced, the impurity concentration of the channel correspondingly increases, narrowing the depletion layer. Where a MOSFET is formed in the Si layer 150 and the P-type Si substrate 110, therefore, the thickness of the Si layer 150 is controlled to 20 nm or more so that the Si layer 150 may have a depth greater than the width of the depletion layer, whereby the characteristics of the MOSFET can be prevented from being adversely affected. As for the upper limit of the layer thickness, the channel of the MOSFET satisfactorily functions with a layer thickness of 200 nm or thereabout, but from the point of view of practicality, the upper limit of the layer thickness is preferably set to about 500 nm.

With regard to conditions for the epitaxial growth, the Si layer 150 is formed, for example, under a pressure of 40 Torr (5.32 kPa) with the substrate temperature kept at 700° C. and with dichlorosilane (SiH$_2$Cl$_2$) gas and hydrogen chloride (HCl) gas introduced at flow rates of 80 SCCM and 10 SCCM, respectively. In order that a crystal defect or the like may not occur in the epitaxial layer, the substrate is preferably baked at a temperature of 900° C. for one minute prior to the epitaxial growth.

Subsequently, the step of forming an STI is carried out.

Figure 6:
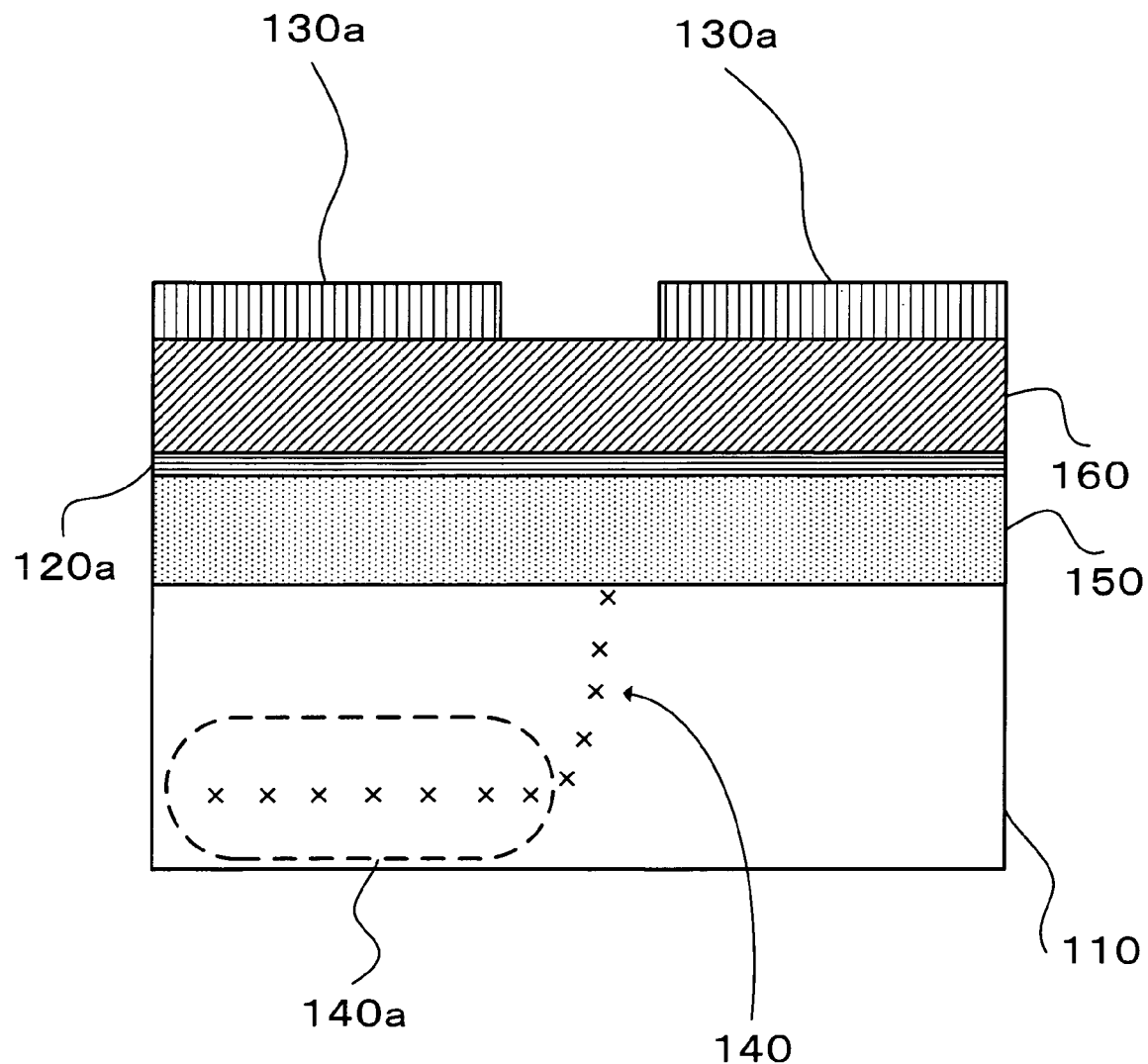
FIG. 6 is a fifth sectional view illustrating a corresponding step of the MOSFET manufacturing method according to the first embodiment.
Figure 7:
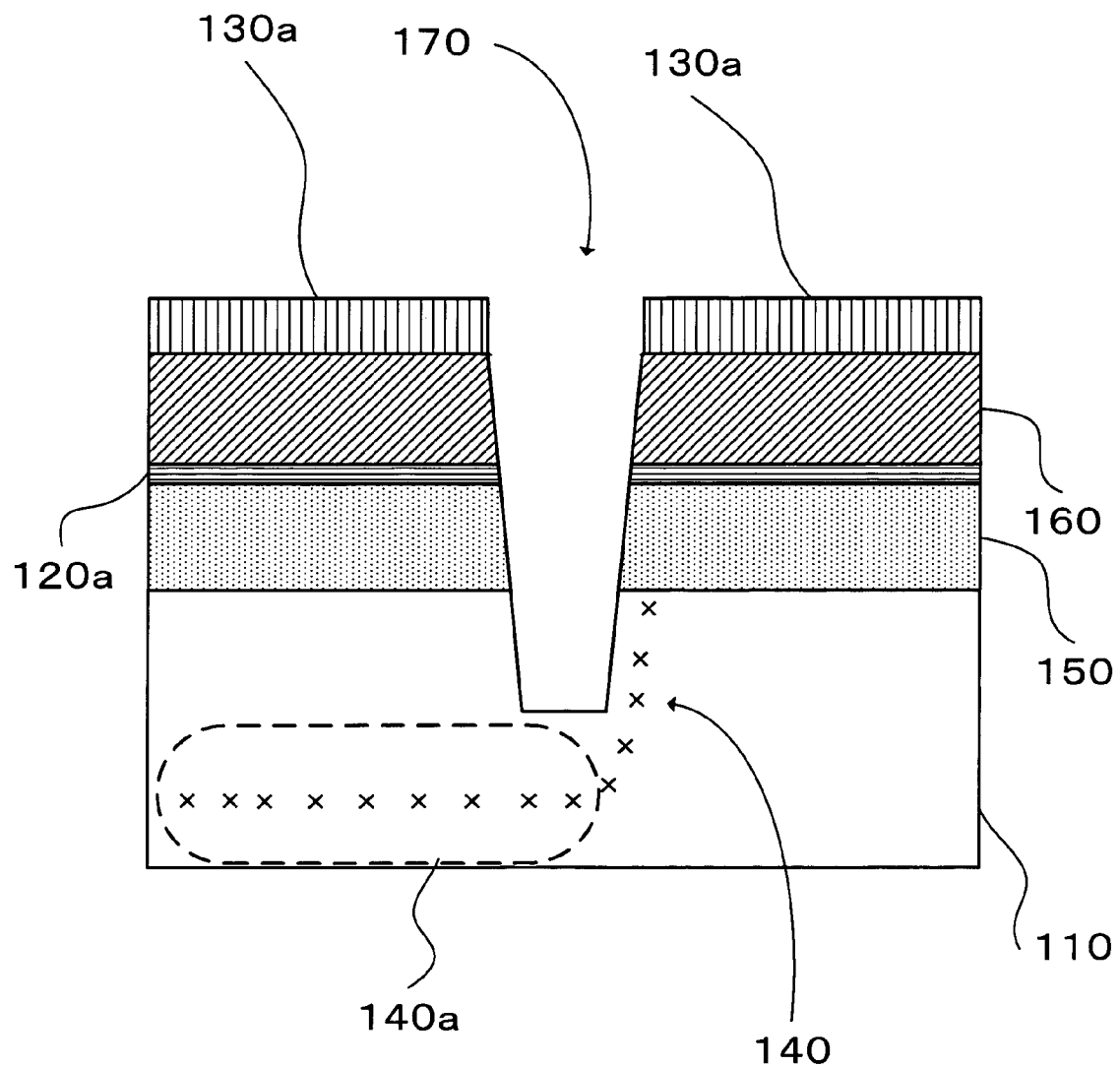
FIG. 7 is a sixth sectional view illustrating a corresponding step of the MOSFET manufacturing method according to the first embodiment.
Figure 8:
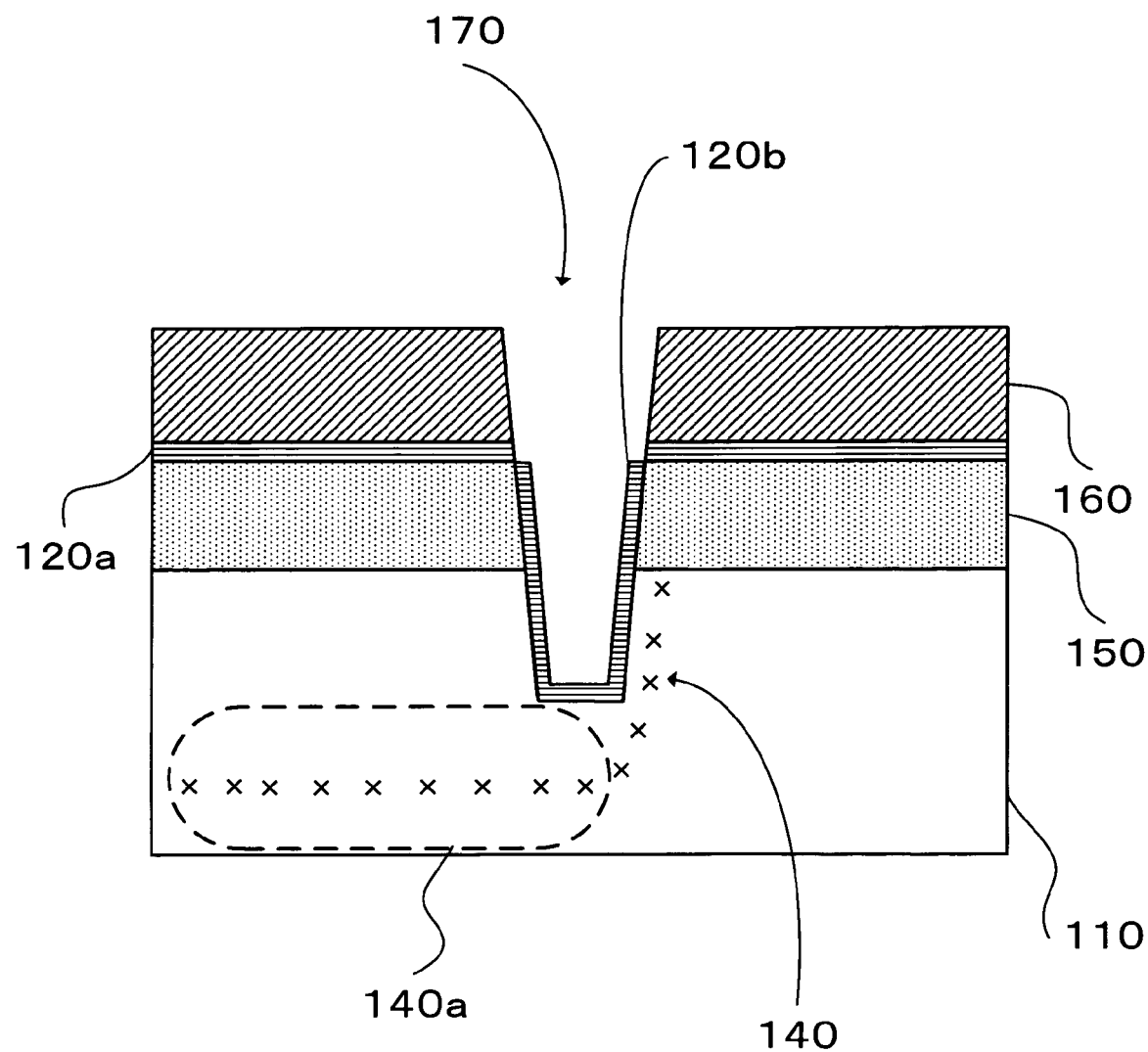
FIG. 8 is a seventh sectional view illustrating a corresponding step of the MOSFET manufacturing method according to the first embodiment.
Figure 9:
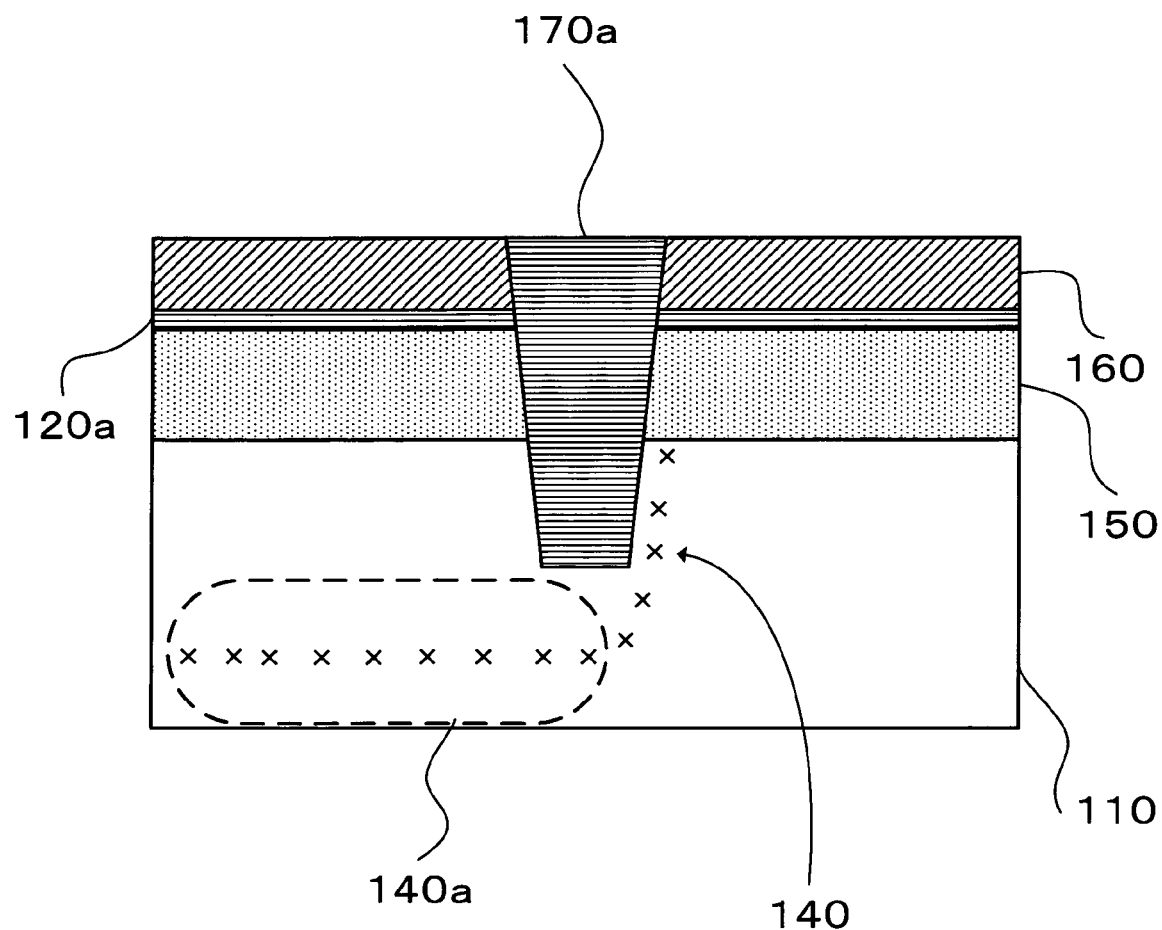
FIG. 9 is an eighth sectional view illustrating a corresponding step of the MOSFET manufacturing method according to the first embodiment.
Figure 10:
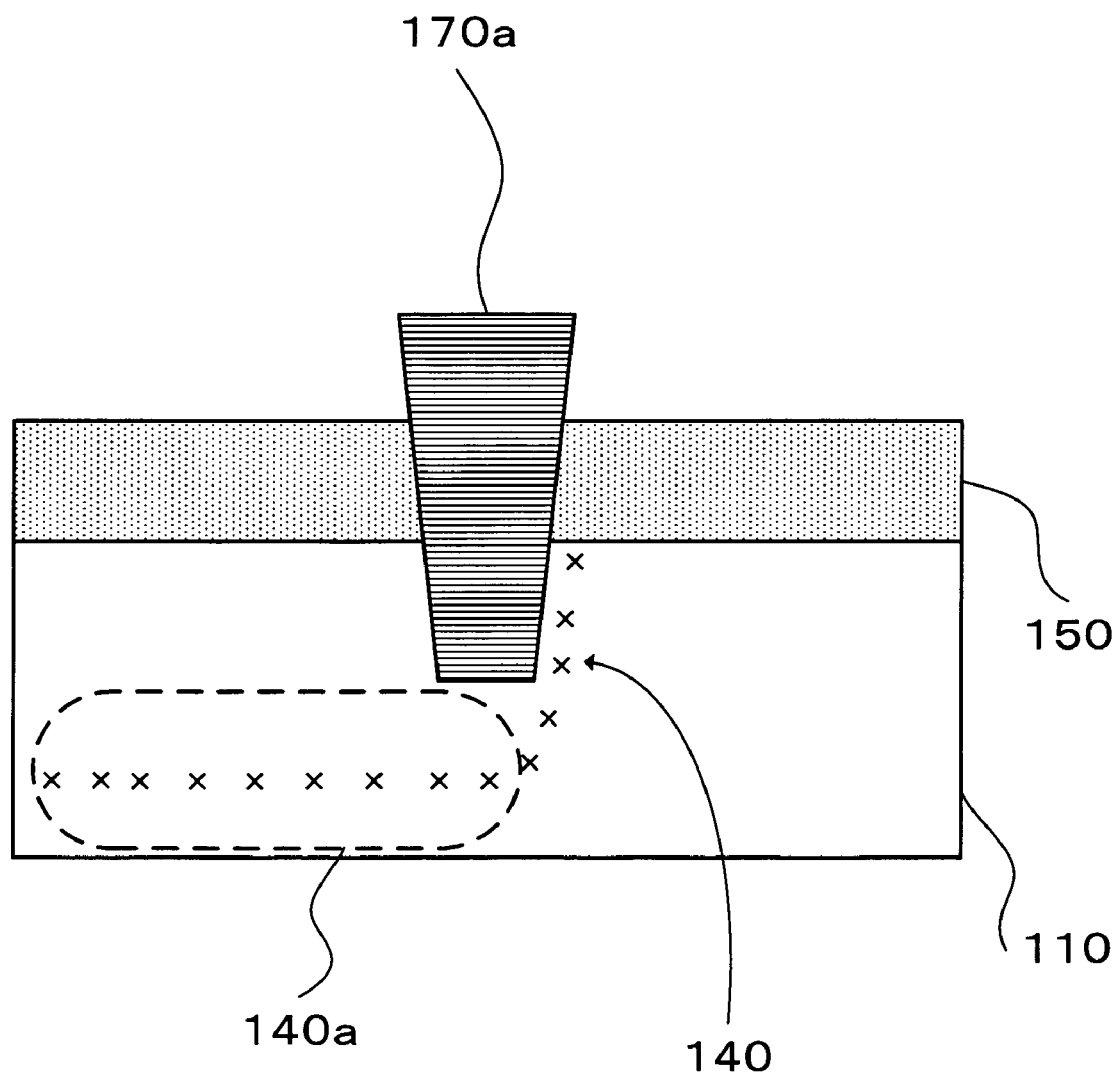
FIG. 10 is a ninth sectional view illustrating a corresponding step of the MOSFET manufacturing method according to the first embodiment.

Following the epitaxial growth of the Si layer 150, an oxide film 120a of 10 nm thick and a silicon nitride (SiN) film 160 of 100 nm thick are successively formed. Then, a photoresist for argon fluoride (ArF) excimer laser exposure is applied, exposed to ArF excimer laser light and developed, to form a photoresist pattern 130a so that the photoresist may remain in regions where active regions are to be formed (FIG. 6). After the photoresist pattern 130a is formed, the SiN film 160, the oxide film 120a, the Si layer 150 and the P-type Si substrate 110 are incised by dry etching to from an STI-burying trench 170 (FIG. 7). Following the formation of the STI trench 170, the photoresist pattern 130a is removed, and then to eliminate etching damage on the inner surface of the STI trench 170, an oxide film 120b of about 5 nm thick is formed on the inner wall of the STI trench 170 (FIG. 8). Subsequently, the oxide film is built up by HDP (High Density Plasma) so as to fill the STI trench 170, and an unnecessary part of the oxide film is removed by CMP (FIG. 9). Then, the SiN film 160 and the oxide film 120a are removed, thus obtaining an STI 170a (FIG. 10).

Subsequently, the step of forming a shallow well is performed.

Figure 11:
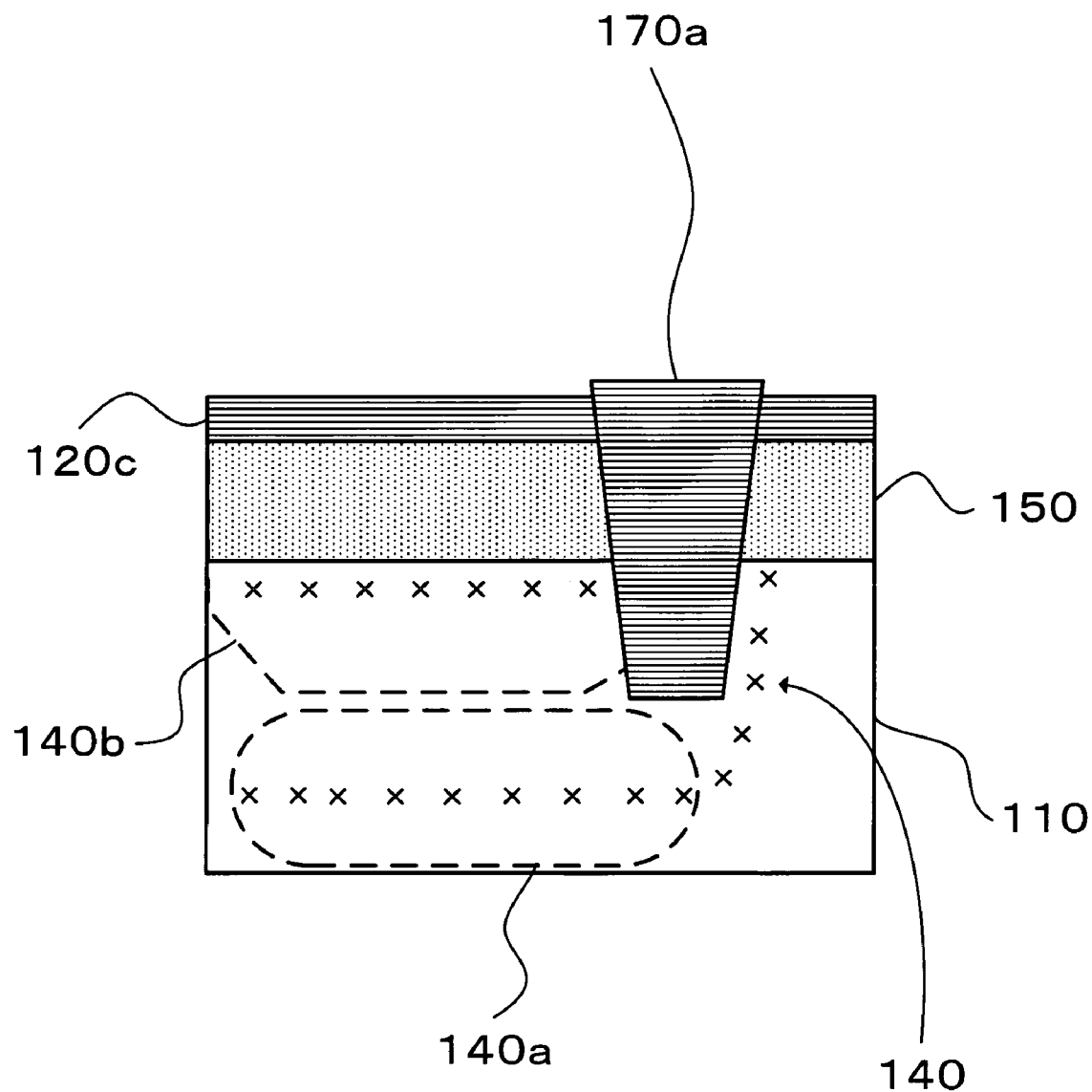
FIG. 11 is a tenth sectional view illustrating a corresponding step of the MOSFET manufacturing method according to the first embodiment.

After forming the STI 170a, an oxide film 120c is formed and then is applied with a photoresist (not shown) for KrF excimer laser exposure. The photoresist is exposed to KrF excimer laser light and developed to form a photoresist pattern with an opening. Using the photoresist pattern (not shown) as a mask, boron (B) ions are implanted if a P-well 140b, for example, is to be formed. Alternatively, where an N-well is to be formed, P ions are implanted. After the doped region is formed, the photoresist pattern is removed (FIG. 11).

Subsequently, the step of forming a MOSFET structure is carried out.

Figure 12:
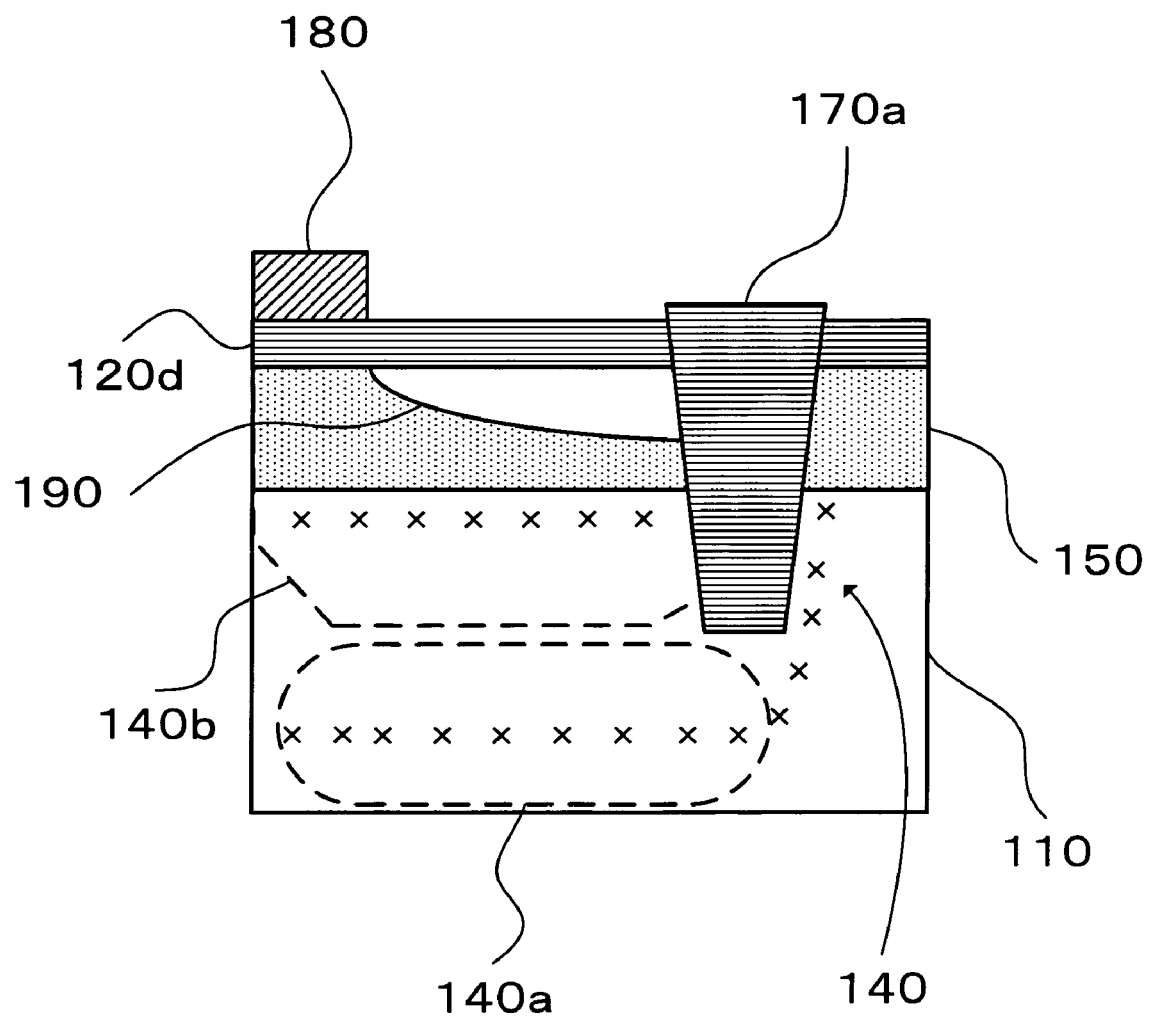
FIG. 12 is an eleventh sectional view illustrating a corresponding step of the MOSFET manufacturing method according to the first embodiment.

First, ion implantation is performed for the purpose of adjusting the threshold voltage of a MOSFET to be formed. In the case of a PMOSFET, for example, arsenic (As) ions are implanted with implantation energy of 100 keV and an implantation dose of $1.0 \times 10^{13}$ cm$^{-2}$. The oxide film 120c is then removed by using a chemical. Subsequently, a gate oxide film 120d and a polysilicon gate 180 are successively formed, and after Extension implantation using B ions or the like and Halo implantation using As ions or the like are carried out, though not illustrated, a sidewall spacer is formed, followed by the formation of a source/drain region 190 with the use of P ions or the like (FIG. 12). On the surface of the gate and source/drain, cobalt silicide (CoSi) or the like is formed by salicide process. Then, wiring and other steps are performed to complete LSI (Large Scale Integration) process.

Thus, according to the MOSFET manufacturing method of the first embodiment, the ions 140 implanted into a shallow region when the deep N-well 140a is formed can virtually be shifted deeper in level than at the time of the ion implantation, making it possible to prevent the ions from exerting an influence on the channel characteristics (threshold voltage etc.) of a MOSFET formed in a subsequent step. Accordingly, in the case of layout design requiring deliberate positioning of the deep N-well 140a, for example, it is unnecessary to take into account the positional relationship between the deep N-well 140a and the MOSFET situated above the well, and since there is no constraint on the positioning, the chip area can be efficiently used and need not be increased.

In the above description, the photoresist pattern 130 for forming the deep N-well 140a is formed by exposing the photoresist to i-line radiation. Alternatively, the photoresist pattern may be formed by exposing a suitable photoresist to KrF excimer laser light, and using the thus-formed photoresist pattern as a mask, the deep N-well 140a may be formed. In this case, a Si layer with a greater thickness of 300 nm to 1 μm is formed by epitaxial growth, whereby the ion-implanted region is virtually shifted deep in level by the amount corresponding to the Si layer thickness, thus enabling the ion-implanted region to function as a deep N-well as in the case of the exposure using i-line radiation.

A MOSFET manufacturing method according to a second embodiment will be now described.

In the MOSFET manufacturing method of the first embodiment, the STI 170a is formed after the Si layer 150 is grown by epitaxy. In the MOSFET manufacturing method of the second embodiment, by contrast, the STI is formed first, and after ions are implanted to form a deep N-well, epitaxial growth is carried out.

FIGS. 13 through 21 are sectional views showing respective steps of the MOSFET manufacturing method according to the second embodiment.

Also in the following description, the photoresist pattern for forming a deep N-well is formed through the exposure to i-line radiation. The photoresist pattern may alternatively be formed by exposing a suitable photoresist to KrF excimer laser light, and using the thus-formed photoresist pattern as a mask, a deep N-well may be formed.

First, the step of forming an STI is carried out.

Figure 13:
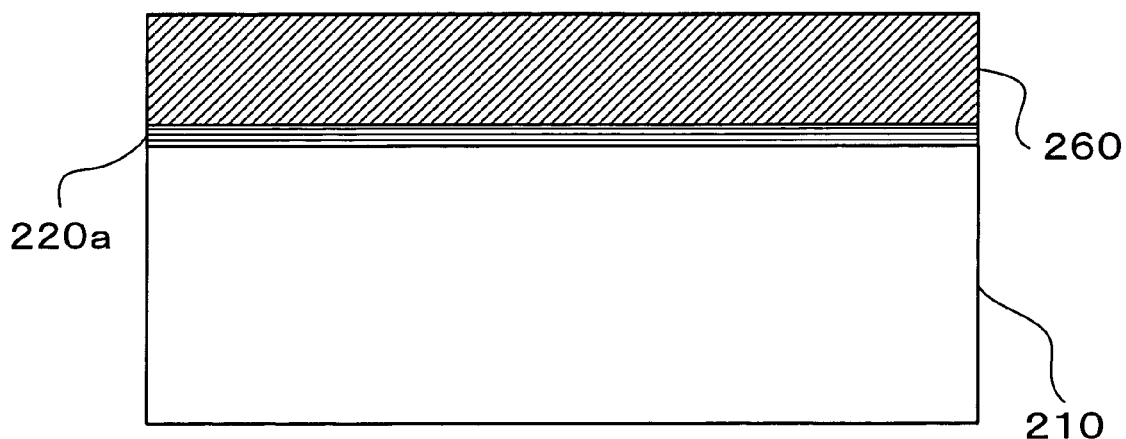
FIG. 13 is a first sectional view illustrating a corresponding step of a MOSFET manufacturing method according to a second embodiment.
Figure 14:
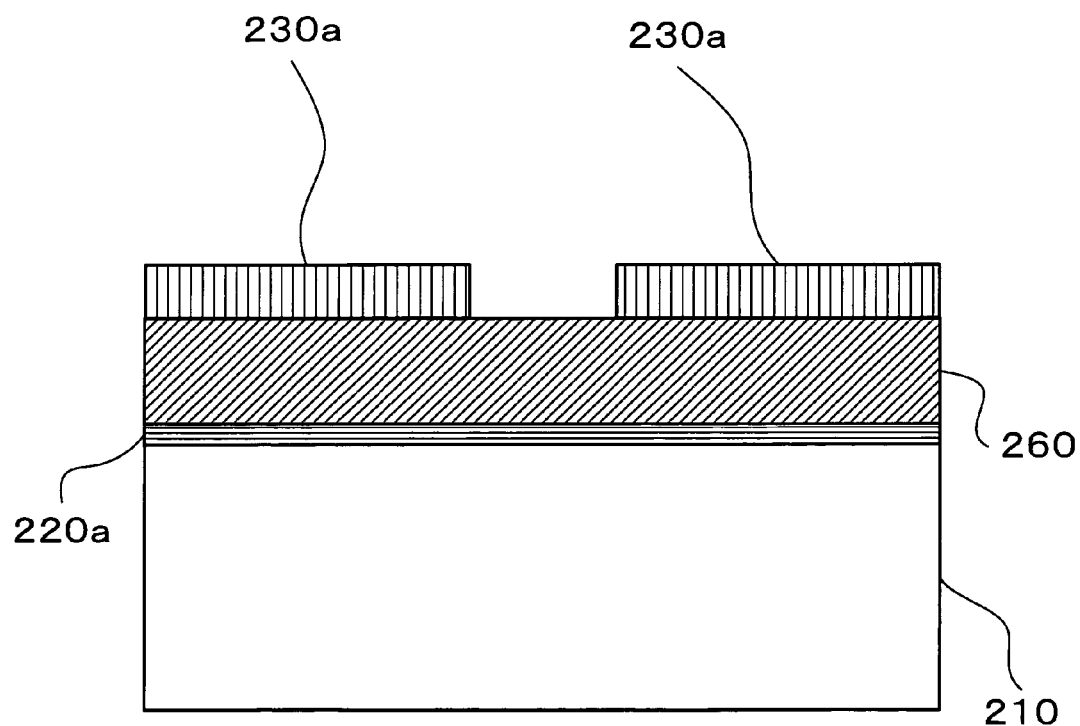
FIG. 14 is a second sectional view illustrating a corresponding step of the MOSFET manufacturing method according to the second embodiment.
Figure 15:
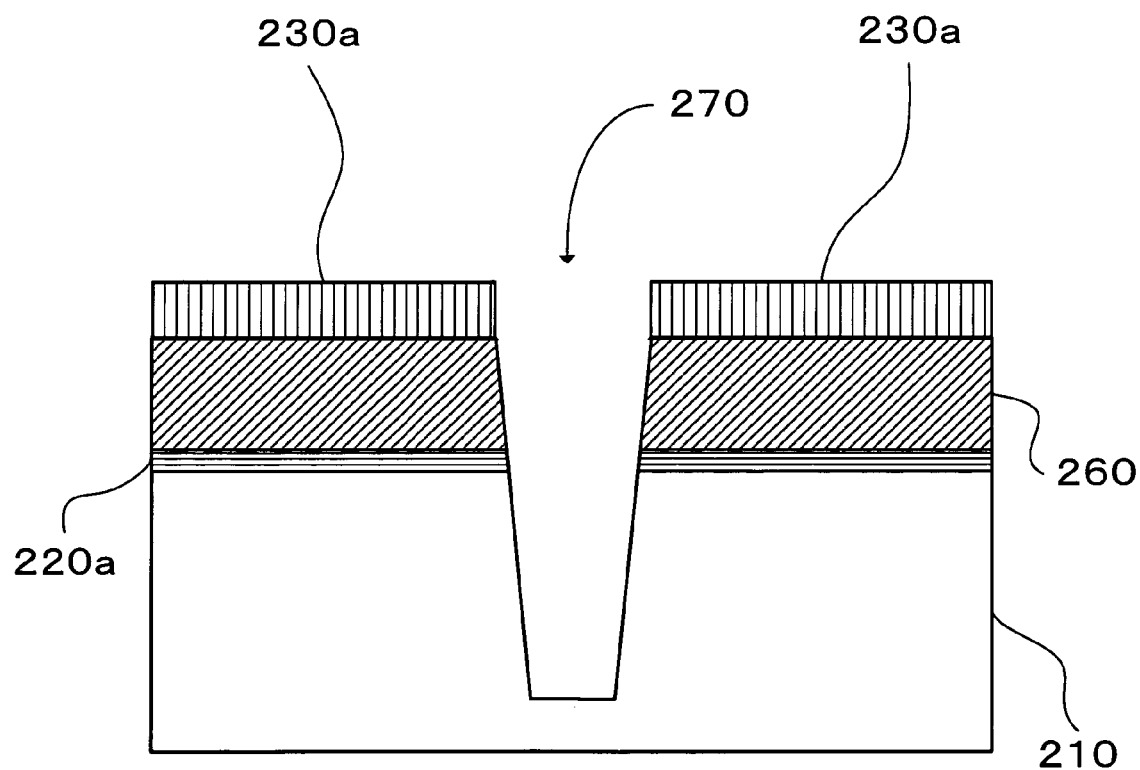
FIG. 15 is a third sectional view illustrating a corresponding step of the MOSFET manufacturing method according to the second embodiment.
Figure 16:
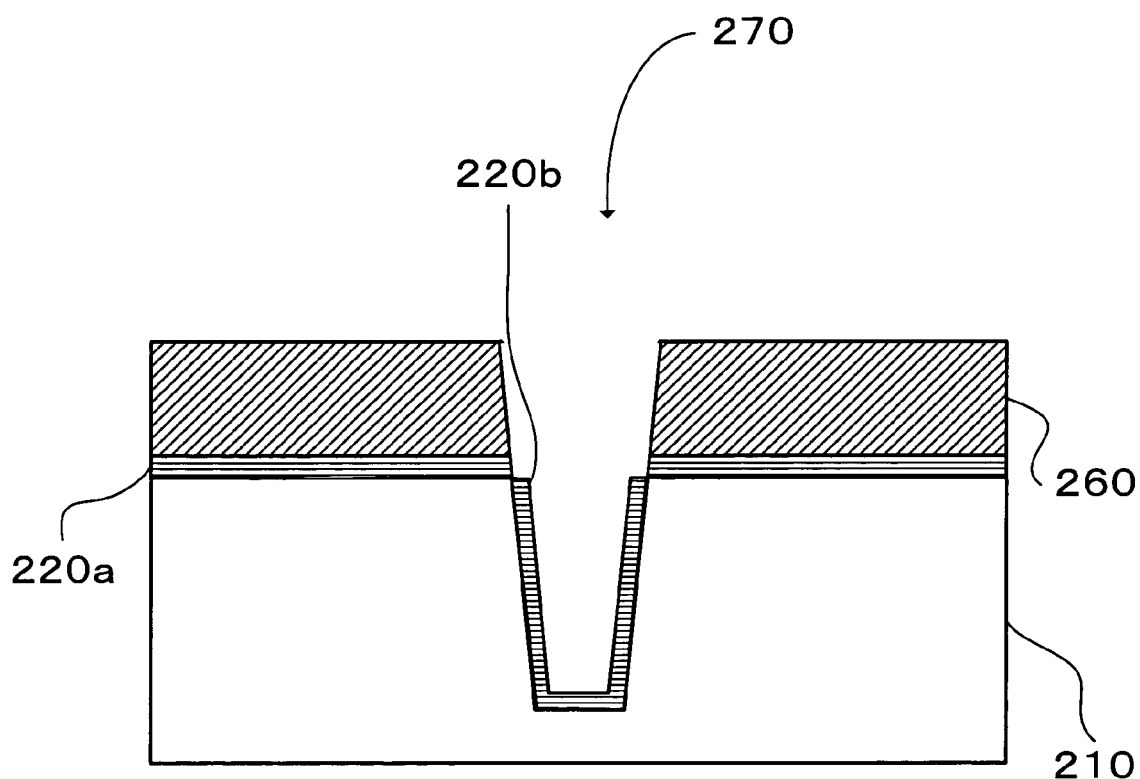
FIG. 16 is a fourth sectional view illustrating a corresponding step of the MOSFET manufacturing method according to the second embodiment.
Figure 17:
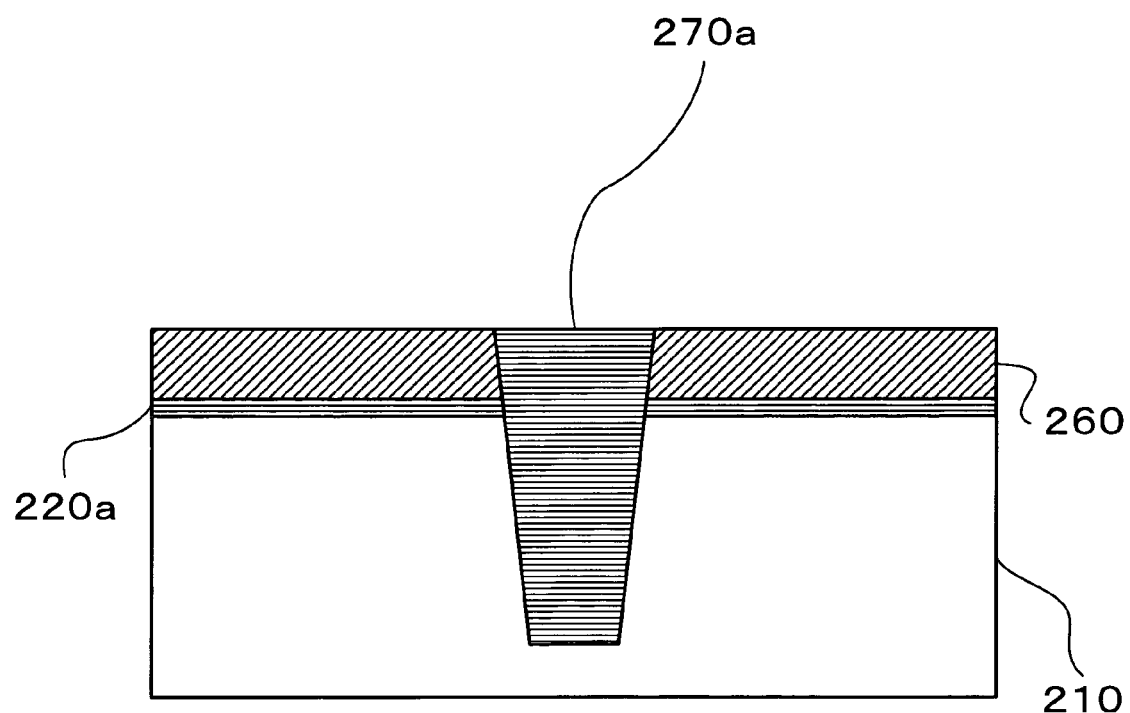
FIG. 17 is a fifth sectional view illustrating a corresponding step of the MOSFET manufacturing method according to the second embodiment.
Figure 18:
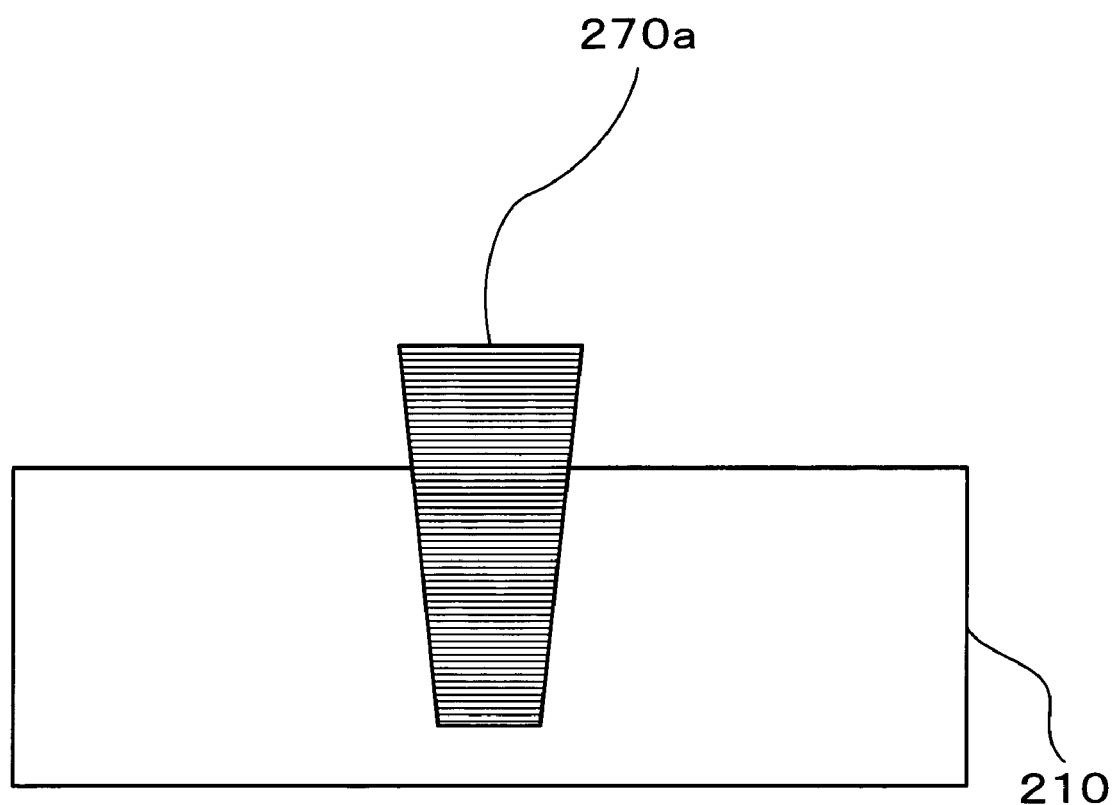
FIG. 18 is a sixth sectional view illustrating a corresponding step of the MOSFET manufacturing method according to the second embodiment.

An oxide film 220a of 10 nm thick and a SiN film 260 of 100 nm thick are successively formed over a P-type Si substrate 210 (FIG. 13). Subsequently, a photoresist (not shown) for ArF excimer laser exposure is applied, then exposed to ArF excimer laser light, and developed to form a photoresist pattern 230a with an opening corresponding to an STI forming region (FIG. 14). Following the exposure and development, the SiN film 260, the oxide film 220a and the P-type Si substrate 210 are incised by dry etching to form an STI-burying trench 270 (FIG. 15). After the STI trench 270 is formed, the photoresist pattern 230a is removed. Then, to eliminate etching damage on the inner surface of the STI trench 270, an oxide film 220b of about 5 nm thick is formed on the inner wall of the STI trench (FIG. 16). Subsequently, the oxide film is built up by HDP so as to fill the STI trench 270, and an unnecessary part of the oxide film is removed by CMP (FIG. 17). Then, the SiN film 260 and the oxide film 220a are removed, thus obtaining an STI 270a (FIG. 18).

Subsequently, the step of forming a deep N-well is performed.

Figure 19:
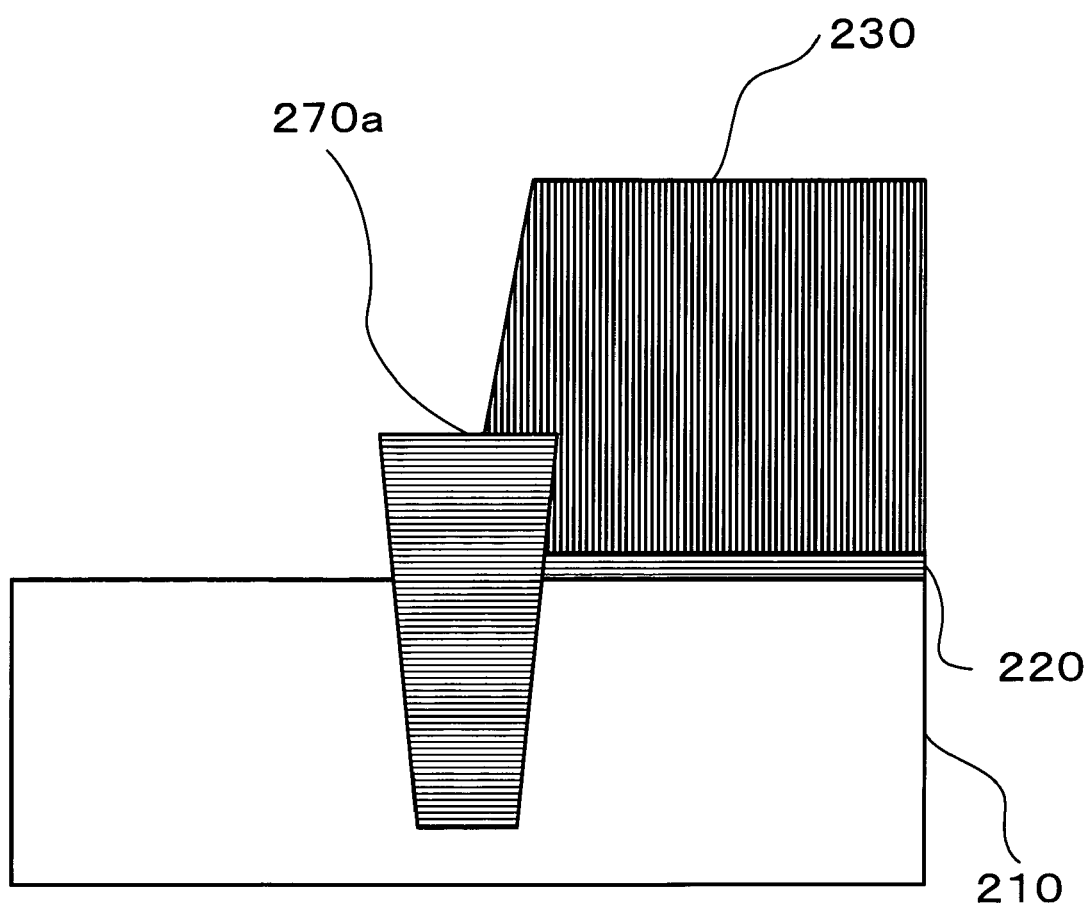
FIG. 19 is a seventh sectional view illustrating a corresponding step of the MOSFET manufacturing method according to the second embodiment.
Figure 20:
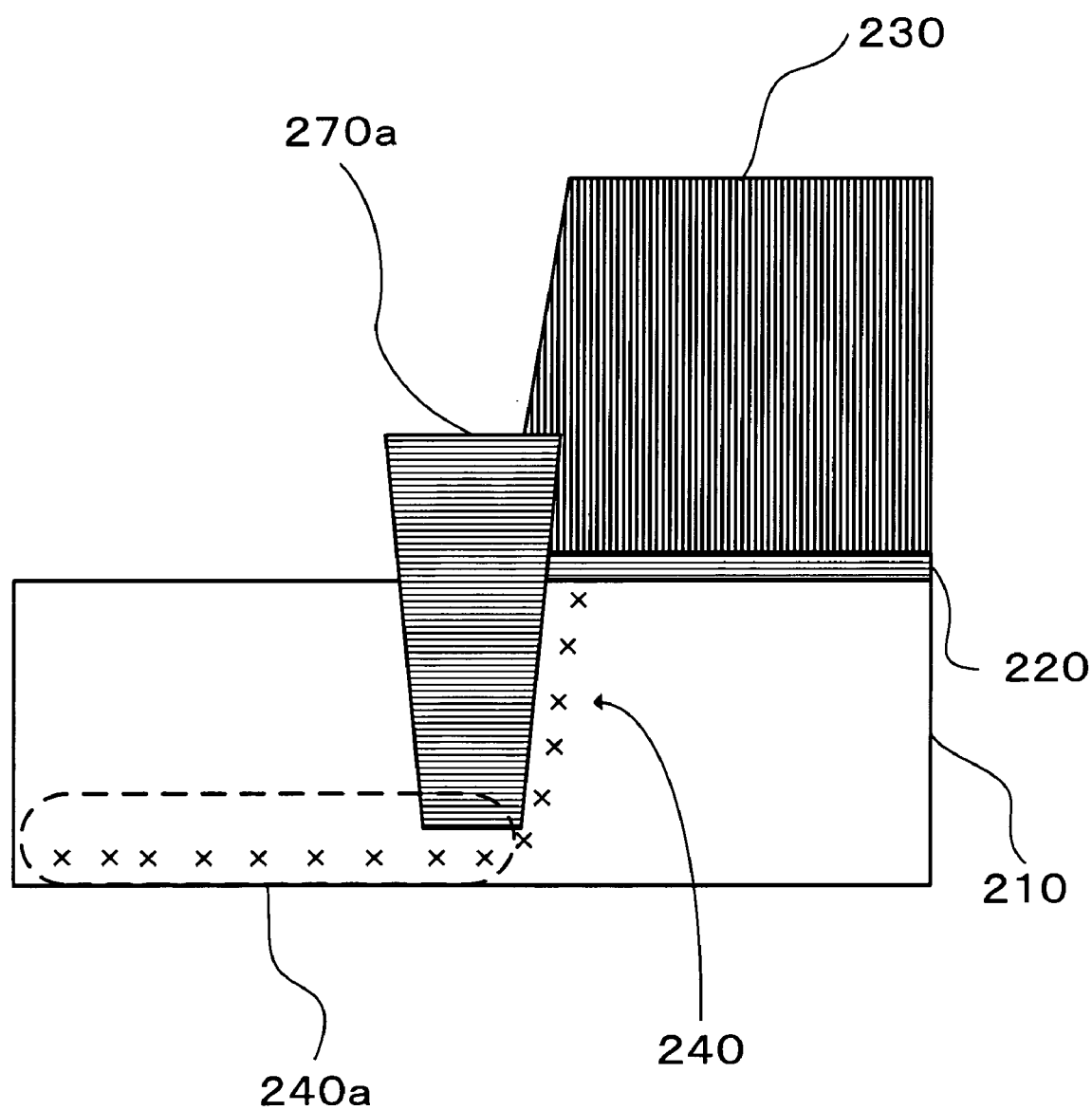
FIG. 20 is an eighth sectional view illustrating a corresponding step of the MOSFET manufacturing method according to the second embodiment.
Figure 21:
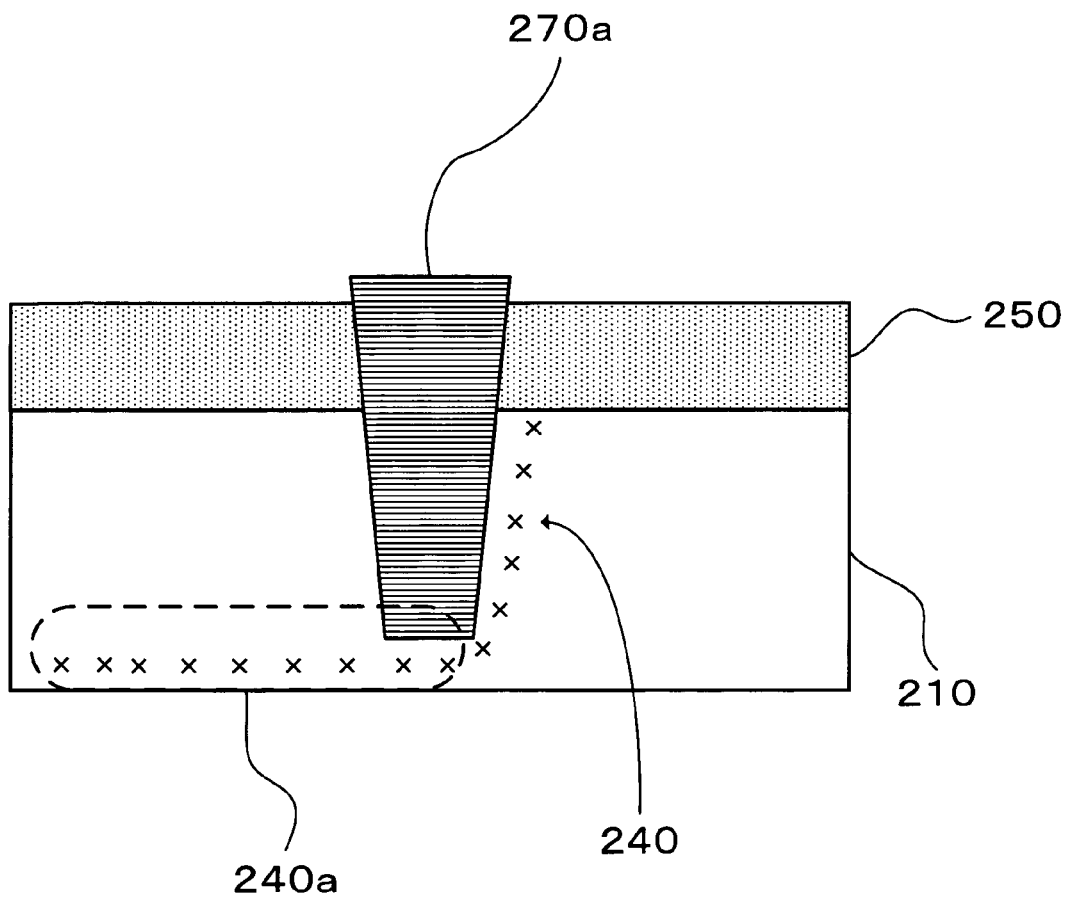
FIG. 21 is a ninth sectional view illustrating a corresponding step of the MOSFET manufacturing method according to the second embodiment.
Figure 22:
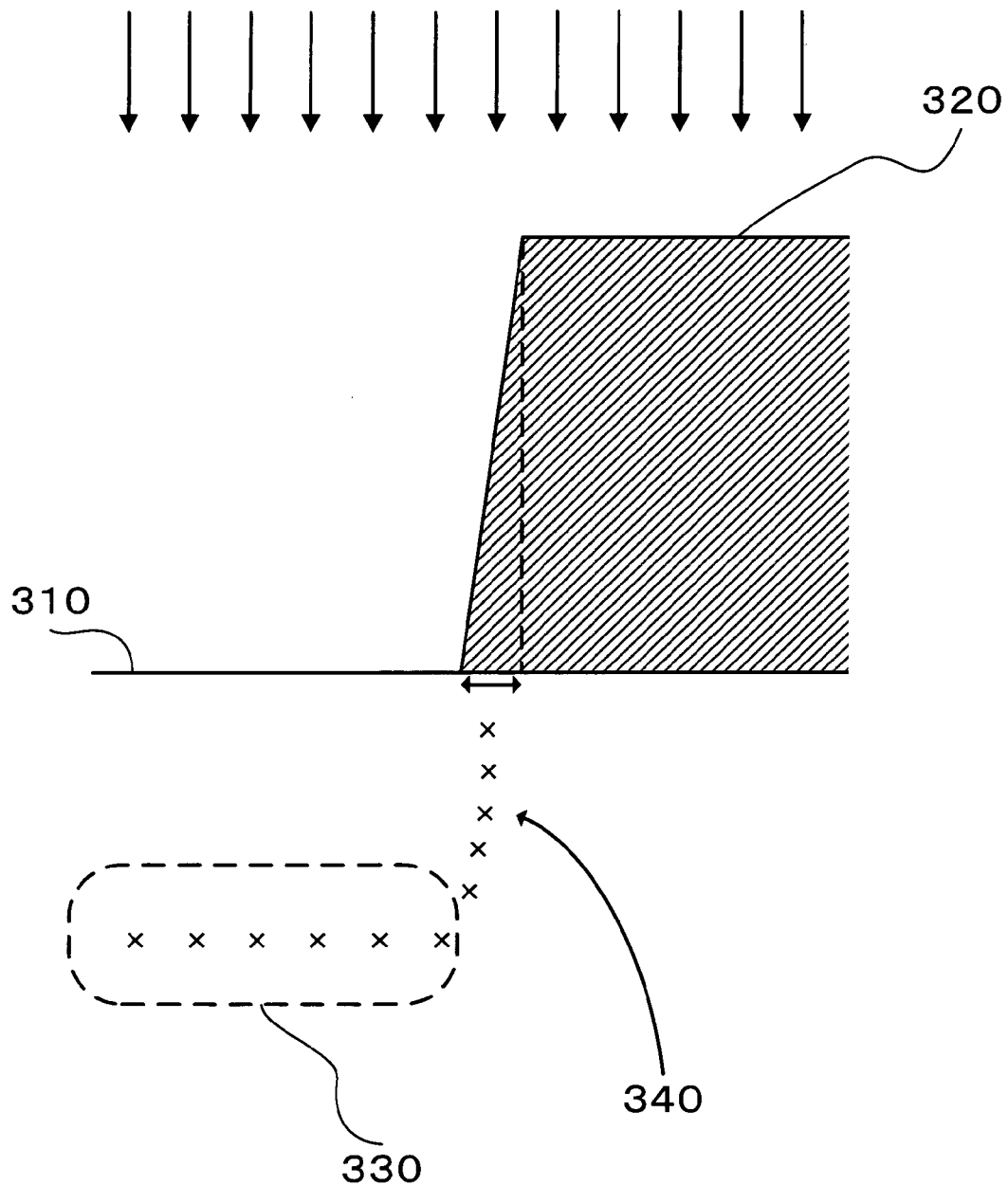
FIG. 22 is a first schematic view illustrating ion implantation for the formation of a doped region.
Figure 23:
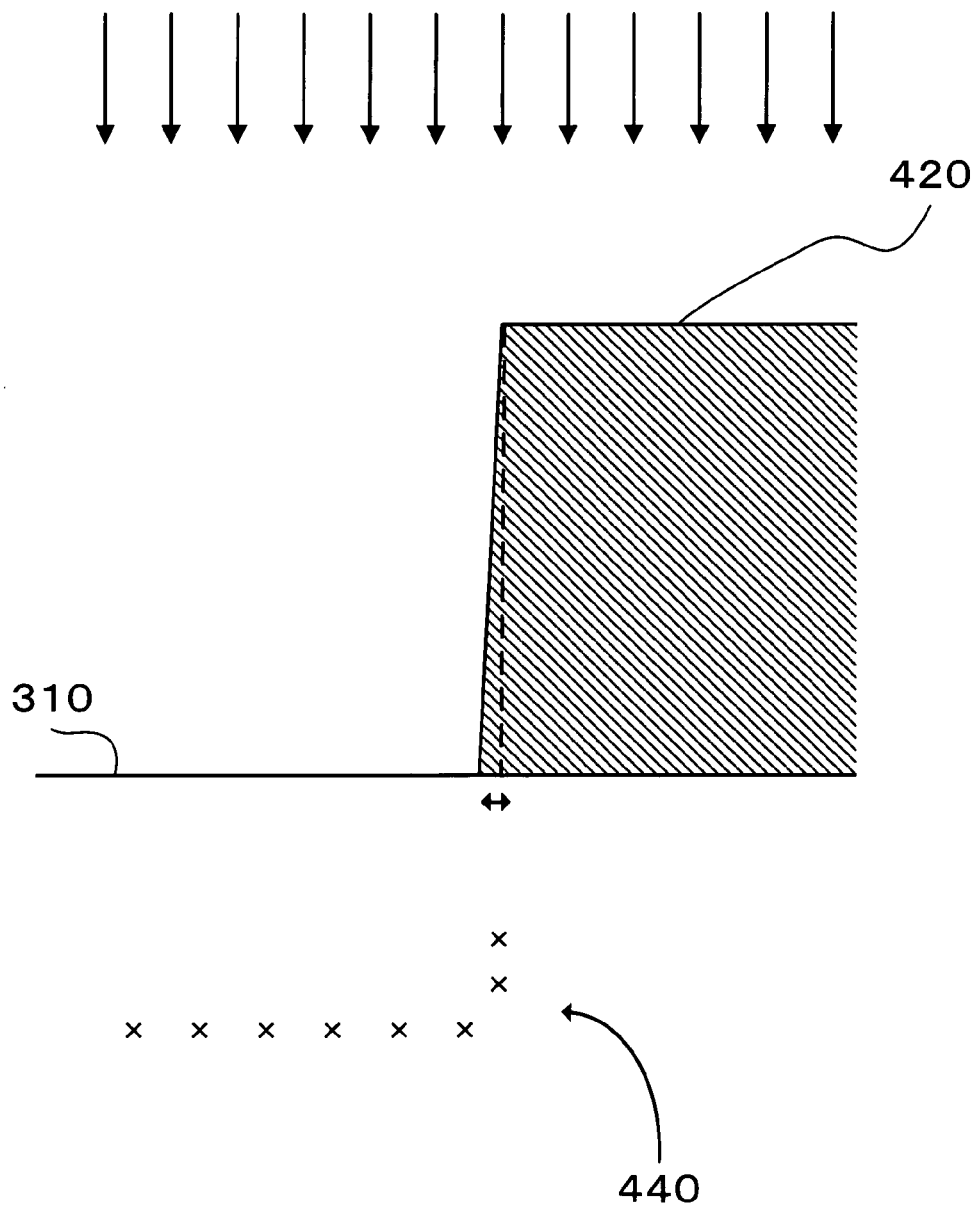
FIG. 23 is a second schematic view illustrating ion implantation for the formation of a doped region.
Figure 24:
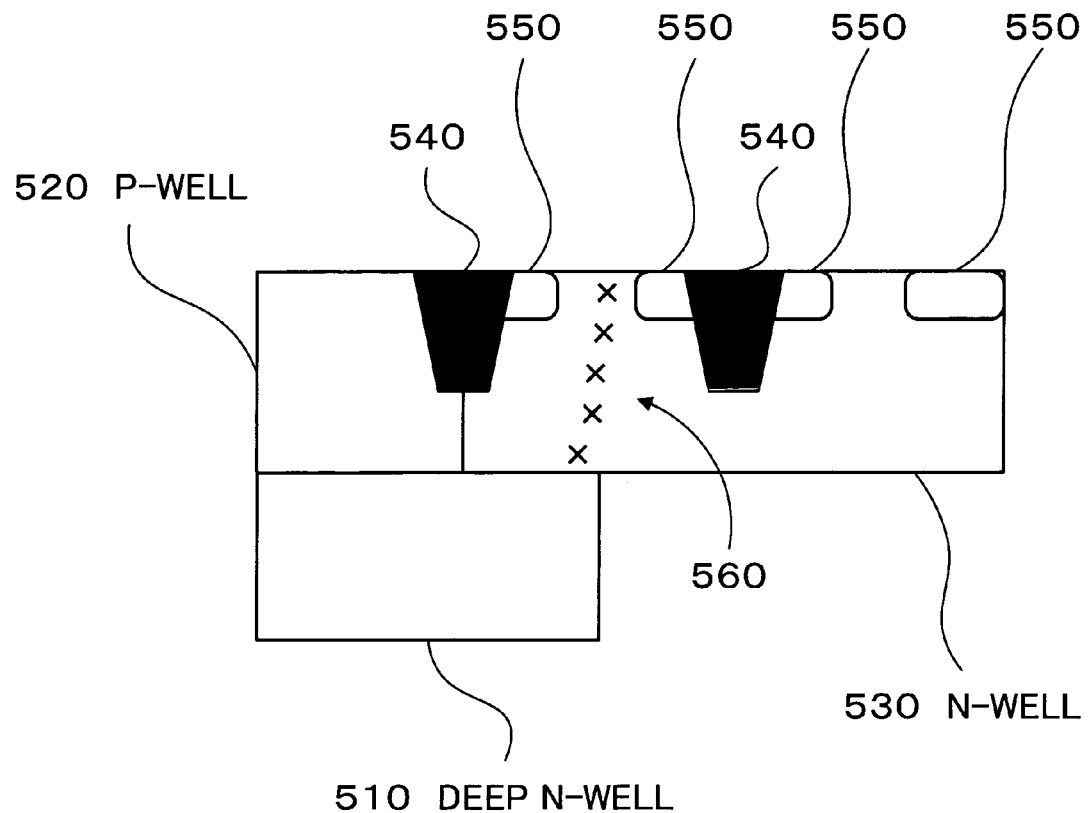
FIG. 24 is a schematic sectional view showing a conventional MOSFET with a triple well structure including a deep well.

An oxide film 220 of 10 nm thick is formed over the P-type Si substrate 210 provided with the STI 270a. Then, a photoresist (not shown) for i-line radiation exposure is applied, exposed to i-line radiation, and developed to form a photoresist pattern 230 with an opening corresponding to a deep N-well forming region (FIG. 19). Subsequently, P ions are implanted with implantation energy of 700 keV and an implantation dose of $1.5 \times 10^{13}$ cm$^{-2}$, thus forming a deep N-well 240a (FIG. 20). After the deep N-well 240a is formed, a Si layer 250 of 20 nm to 200 nm thick is grown by epitaxy over the P-type Si substrate 210 from which the photoresist pattern 230 and the oxide film 220 have been removed (FIG. 21).

Subsequently, as in the MOSFET manufacturing method of the first embodiment, a shallow well is formed, followed by the MOSFET structure forming step, the wiring step, etc.

Thus, also in the second embodiment, the ions 240 implanted into a shallow region when the deep N-well 240a is formed can virtually be shifted deeper in level than at the time of the ion implantation, like the first embodiment, making it possible to prevent the ions from exerting an influence on the channel characteristics (threshold voltage etc.) of a MOSFET formed in a subsequent step. Accordingly, in the case of layout design requiring deliberate positioning of the deep N-well 240a, for example, it is unnecessary to take into account the positional relationship between the deep N-well 240a and the MOSFET situated above the well, and since there is no constraint on the positioning, the chip area can be efficiently used and need not be increased.

In the first and second embodiments, a region doped with a P- or N-type impurity and a deep region doped with an N-type impurity are formed in a P-type Si substrate. The same advantages as stated above can be obtained also in the case of an N-type Si substrate in which are formed a region doped with a P- or N-type impurity and a deep region doped with a P-type impurity.

In the semiconductor device manufacturing method of the present invention, a photoresist with a thickness matching the wavelength of exposure light is formed over a semiconductor substrate and then is exposed to the exposure light to form a photoresist pattern with an opening corresponding to a region for forming a first well. Subsequently, using the photoresist pattern as a mask, ions are implanted to form the first well, and after the photoresist pattern is removed, an epitaxial layer is grown over the semiconductor substrate. Thus, even in the case where i-line radiation, for example, is used for the exposure and ions are implanted into a shallow region for forming a second well when the first well is formed, the ion-implanted region is virtually shifted deeper in level than at the time of the ion implantation by an amount corresponding to the thickness of the epitaxial layer, whereby a MOSFET formed later in the second region can be prevented from being influenced by the ions. It is therefore unnecessary to take into account the influence of the ions implanted into the shallow region, permitting the MOSFET to be arranged in a desired position and thus eliminating the need for increasing the chip area.

The first well is also virtually shifted deeper in level than at the time of the ion implantation by the amount corresponding to the thickness of the epitaxial layer. Accordingly, even with the use of a photoresist with a thickness suited for the exposure using KrF excimer laser light, a deep well deeper than the second well can be formed with ease.

Also, the semiconductor device of the present invention has the epitaxial layer which is grown over the semiconductor substrate after the formation of the deep well. Thus, even in the case where ions are implanted into a shallow well forming region when the deep well is formed, the ion-implanted region is virtually shifted deeper in level than at the time of the ion implantation by an amount corresponding to the thickness of the epitaxial layer, whereby a MOSFET formed later in the shallow well can be prevented from being influenced by the ions. It is therefore unnecessary to take into account the influence of the ions implanted into the shallow region, permitting the MOSFET to be arranged in a desired position and thus eliminating the need for increasing the chip area.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device comprising:
   forming, over a semiconductor substrate, a photoresist;
   exposing the photoresist to form a photoresist pattern with an opening;
   implanting first impurities into the semiconductor substrate by using the photoresist pattern as a mask, to form a first well in the semiconductor substrate;
   removing the photoresist pattern;

growing an epitaxial layer on the semiconductor substrate after the first well is formed and the photoresist pattern is removed;

forming an isolation region after the epitaxial layer is grown;

after the forming of the isolation region, implanting second impurities into the epitaxial layer to form a second well;

after the forming of the second well, forming a gate oxide film over the epitaxial layer;

forming a polysilicon gate over the gate oxide film; and implanting third impurities into the epitaxial layer using the polysilicon gate as a mask to form a source region and a drain region.

2. The method of manufacturing a semiconductor device according to claim 1, wherein the exposure light is i-line radiation.

3. The method of manufacturing a semiconductor device according to claim 2, wherein the epitaxial layer is grown to a thickness of 20 nm to 500 nm.

4. The method of manufacturing a semiconductor device according to claim 1, wherein the exposure light is krypton fluoride excimer laser light.

5. The method of manufacturing a semiconductor device according to claim 4, wherein the epitaxial layer is grown to a thickness of 300 nm to 1 μm.

6. The method of manufacturing a semiconductor device according to claim 1, wherein the semiconductor substrate is a P-type semiconductor substrate, the second well is a region doped with an N- or P-type impurity, and the first well is a region doped with an N-type impurity.

7. The method of manufacturing a semiconductor device according to claim 1, wherein the semiconductor substrate is an N-type semiconductor substrate, the second well is a region doped with a P- or N-type impurity, and the first well is a region doped with a P-type impurity.

8. The method of manufacturing a semiconductor device according to claim 1, wherein, after the photoresist pattern is removed, the semiconductor substrate is baked at a temperature of 900° C. for one minute and then the epitaxial layer is grown over the semiconductor substrate.

9. The method of manufacturing a semiconductor device according to claim 1, wherein the epitaxial layer is grown under a pressure of 40 Torr with temperature of the semiconductor substrate kept at 700° C. and with dichlorosilane gas and hydrogen chloride gas introduced at flow rates of 80 SCCM and 10 SCCM, respectively.

10. The method of manufacturing a semiconductor device according to claim 1, wherein the first well is formed by implanting phosphorus ions with implantation energy of 700 keV and an implantation dose of $1.5 \times 10^{13}$ cm$^{-2}$.

11. The method of manufacturing a semiconductor device according to claim 1, wherein the first well and the second well are of same conductive type.

12. The method of manufacturing a semiconductor device according to claim 1, wherein the growing grows the epitaxial layer directly on the semiconductor substrate after the first well is formed and the photoresist pattern is removed.

* * * * *